United States Patent [19]
Kornrumpf et al.

[11] Patent Number: 5,351,001
[45] Date of Patent: Sep. 27, 1994

[54] MICROWAVE COMPONENT TEST METHOD AND APPARATUS

[75] Inventors: William P. Kornrumpf, Albany; David A. Bates, Fayetteville, both of N.Y.

[73] Assignee: General Electric Company, Schenectady, N.Y.

[21] Appl. No.: 504,803

[22] Filed: Apr. 5, 1990

[51] Int. Cl.$^5$ .................. G01R 1/04; H01L 23/48
[52] U.S. Cl. ..................... 324/158.1; 257/48
[58] Field of Search ............ 324/158 F, 158 P, 72.5, 324/73.1

[56] References Cited

U.S. PATENT DOCUMENTS

| | | | |
|---|---|---|---|
| 3,775,644 | 11/1973 | Cotner et al. | 324/158 F |
| 4,707,656 | 11/1987 | Marzan | 324/158 P |
| 4,714,516 | 12/1987 | Eichelberger et al. | 156/628 |
| 4,769,591 | 9/1988 | Binet et al. | 324/158 F |
| 4,780,177 | 10/1988 | Wojnarowski et al. | 156/643 |
| 4,783,695 | 11/1988 | Eichelberger et al. | 357/65 |
| 4,835,704 | 5/1989 | Eichelberger et al. | 364/490 |
| 4,851,764 | 7/1989 | Usai | 324/158 F |
| 4,878,991 | 11/1989 | Eichelberger et al. | 156/630 |
| 4,882,200 | 11/1989 | Liu et al. | 427/53.1 |
| 4,884,122 | 11/1989 | Eichelberger et al. | 357/71 |
| 4,894,115 | 1/1990 | Eichelberger et al. | 156/643 |
| 4,897,153 | 1/1990 | Cole et al. | 156/643 |
| 4,897,601 | 1/1990 | Hirsch et al. | 324/158 F |
| 4,933,042 | 6/1990 | Eichelberger et al. | 156/239 |
| 4,960,613 | 10/1990 | Cole et al | 427/53.1 |
| 4,961,050 | 10/1990 | Harwood et al. | 324/158 P |
| 4,988,412 | 1/1991 | Liu et al. | 204/15 |

Primary Examiner—Gregory C. Issing
Attorney, Agent, or Firm—Robert Ochis; Geoffrey Krauss

[57] ABSTRACT

A test fixture for testing microwave components enables components to be tested with high correlation between the component's test results and its operation in a system. The test fixture provides for non-destructive mounting of and connection of the component to the test fixture in the same manner as it will be connected in the final system and also provides for tailoring of the test connections as may be desired.

17 Claims, 8 Drawing Sheets

MICROWAVE COMPONENT TEST METHOD AND APPARATUS

RELATED APPLICATIONS

The present invention is related to U.S. Pat. No. 5,206,712, entitled, "A Building Block Approach to Microwave Modules", by W. P. Kornrumpf, et al., application Ser. No. 07/504,821 now abandoned, entitled, "High Density Interconnected Microwave Circuit Assembly", by W. P. Kornrumpf, et al.; , application Ser. No. 07/504,753, entitled, "A Compact High Density Interconnected Microwave System" by W. P. Kornrumpf; application Ser. No. 07/504,769 now abandoned, entitled, "A Flexible High Density Interconnect Structure and Flexibly Interconnected System" by C. W. Eichelberger, et al. and application Ser. No. 07/504,748, "Microwave Component Having Tailored Operating Characteristics and Method of Tailoring", by W. P. Kornrumpf, et al. each of which is being filed concurrently herewith and each of which is incorporated herein by reference in its entirety.

BACKGROUND OF THE INVENTION

1. Field of the Invention

The present invention relates to the field of microwave circuits, and more particularly, to testing of monolithic microwave integrated circuits and other active and passive microwave components.

2. Background Information

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to its input to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths and configurations, resulting in varied electrical reactance and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2-GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

In digital systems, individual chips can be extensively tested using wafer probe and other test systems before being committed to assembly into individual packages. After packaging, they can be further tested prior to assembly into a system. As a result, yield at system assembly is normally quite high. It is this assurance of successful assembly of digital components into an operative final system which has made feasible the provision of microcomputers and other digital systems at cost-for-performance prices which were unimaginable a decade ago.

Such pre-packaging has been impossible with active microwave devices because the losses and other penalties which packaging introduces are worse than the disease packaging would be intended to cure. Consequently, for microwave systems, post-packaging testing is not available at a component level as a final-assemblyyield-enhancement mechanism. Even full testing of components at a wafer level is not normally feasible because of the relatively large probe which is needed to provide an impedance match to the MMICs or other devices under test. However, the problem of low final yield has led to the design of some active microwave components for testing with so-called co-planar probe such as those built by Cascade Microtech. This requires that the chips be made over-sized in order to provide space on their upper surface for a microwave port having a signal conductor in the middle and two true ground conductors symmetrically disposed on opposite sides of that signal conductor. This structure is required for a co-planar probe to be connected to this microwave port in a well-matched, repeatable manner. The provision of a true ground on the upper surface of a microwave chip is not a simple matter at microwave frequencies (unlike the situation with digital chips which typically operate at frequencies of less than 50 MHz). Generally, this requires the use of a metal connection between the front and back surfaces of the chip. Such metal connections can be provided by plated through holes, but the provision of plated through holes increases the complexity of the fabrication process and decreases yield. Even those chips which are designed for co-planar probing cannot be tested at full power across their full operative range with a co-planar probe prior to die attach because of the poor thermal conductivity of MMICs. Consequently, design of a microwave device for co-planar probing has its own associated penalties such as increased size, increased process complexity, lower process yield and still suffers from a lack of complete assurance that test results will correlate with system performance.

A significant problem with the low yield of fully assembled systems is that such structures cannot be effectively reworked to replace faulty components because the component's connections cannot be removed in a non-destructive manner. Consequently, systems which are out of specification when assembled must be scrapped. Alternatively, if the microwave module is designed to allow rework, rework-induced damage is common, with a consequent limited rework-induced increase in yield.

Thus, there is a continuing need for a microwave fabrication process which enables passive components to be fabricated with highly repeatable characteristics and which enables pre-testing of active devices and/or the removal and replacement of faulty components without impairing any good components when a system fails to meet specifications.

Because of the low yield of finally assembled microwave systems, such systems are quite expensive both because of ultimate component cost and because the fabrication process is more akin to engineering than to semiconductor fabrication techniques. In order to increase the yield of final systems and to reduce their cost to the point where they become feasible for use in everyday systems, there is a need for a technique for testing individual microwave components and subsystems in an efficient, high yield manner which enables such components and subsystems to be assembled into final systems with a high yield.

A substantial problem with presently available techniques for testing monolithic microwave integrated circuits (MMICs) is that test results do not correlate well with the component's operation when assembled into a system. This has a number of causes. One is that much testing is done at DC rather than at microwave frequencies because of the problems of providing good microwave coupling between a test system and a MMIC. Another is the requirement that microwave components be made oversized in order to provide a well matched coupling between the component and a test system—a requirement which makes testing much less attractive than it could be. Further, because of the poor thermal conductivity of a MMIC and the inability of test fixtures to carry away the heat generated, full power, full frequency testing of such components is not feasible even with oversized components designed for connection to a test probe. Further, the component to be tested cannot be connected to the test system in the same way in which it will be ultimately connected into a system because such system connections are permanent and not reworkable. Consequently, there is a poor correlation between test measurements and the system performance of components even when the tradeoff decisions are made in favor of testing. Consequently, there is a need for a microwave test technique and system which enables microwave components to be fully tested, both in power and frequency, without requiring that the components be fabricated oversized to facilitate such testing and which provides high correlation between test results and subsequent system performance of those tested components.

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic (or compatible metal) substrate such as alumina which may be 25–100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom must be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane. Thereafter, a polyimide film which may be Kapton ® polyimide, available from E. I. du Pont de Nemours Company, which is about 0.0005–0.003 inch (12.5–75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser which is scanned relative to the substrate to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, now abandoned filed Sep. 27, 1988, entitled "Method and Apparatus for Removing Components Bonded to a Substrate" by R. J. Wojnarowski, et al.; U.S. patent application Ser. No. 310,149, filed Feb. 14, 1989, now U.S. Pat. No. 4,894,115, issued Jan. 16, 1991 entitled "Laser Beam Scanning Method for Forming Via Holes in Polymer Materials" by C. W. Eichelberger, et al.; U.S. patent application Ser. No. 312,798, now abandoned filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, now U.S. Pat. No. 4,878,991, issued Nov. 7, 1989 entitled "Simplified Method for Repair of High Density Interconnect Circuits" by C. W. Eichelberger, et al.; U.S. patent application Ser. No. 305,314, filed Feb. 3, 1989, abandoned in favor of continuation application Ser. No. 559,532, filed Jul. 19, 1990 entitled "Fabrication Process and Integrated Circuit Test Structure" by H. S. Cole, et al.; U.S. Pat. No. 5,019,946, filed Sep. 27, 1988, entitled "High Density Interconnect With High Volumetric Efficiency" by C. W. Eichelberger, et al.; U.S. Pat. No. 5,019,535, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, now U.S. Pat. No. 4,960,613, issued Oct. 2, 1990 entitled "Laser Interconnect Process" by H. S. Cole, et al.; U.S. patent application Ser. No. 230,654, filed Aug. 5, 1988, now U.S. Pat. No. 4,884,122, issued Nov. 28, 1989 entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 18, 1988, now abandoned entitled "Direct Deposition of Metal Patterns for Use in Integrated Circuit Devices" by Y. S. Liu, et al.; U.S. Patent application Ser. No. 237,638, filed Aug. 23, 1988, now U.S. Pat. No. 4,882,200, issued Nov. 21, 1989 entitled "Method for Photopatterning Metallization Via UV Laser Ablation of the Activator" by Y. S. Liu, et al.; U.S. patent application Ser. No. 237,685, filed Aug. 25, 1988, now abandoned entitled "Direct Writing of Refractory Metal Lines for Use in Integrated Circuit Devices" by Y. S. Liu, et al.; U.S. patent application Ser. No. 240,367, filed Aug. 30, 1988, now U.S. Pat. No. 4,933,042, issued Jun. 12, 1990 entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, now U.S. Pat. No. 4,897,153, issued Jan. 30, 1990 entitled "Method of Processing Siloxane-Polyimides for Electronic Packaging Applications" by H. S. Cole, et al.; U.S. patent application 289,944, filed Dec. 27, 1988, now U.S. Pat. 4,988,412, issued Jan. 29, 1991 entitled "Selective Electrolytic Deposition on Conductive and Non-Conductive Substrates" by Y. S. Liu, et al.; U.S. patent application Ser. No. 312,536, filed Feb. 17, 1989, now abandoned entitled "Method of Bonding a Thermoset Film to a Thermoplastic Material to Form a Bondable Laminate" by R. J. Wojnarowski; U.S. patent application Ser. No. 363,646, now abandoned filed Jun. 8, 1989, entitled "Integrated Circuit Packaging Configuration for Rapid Customized Design and Unique Test Capability" by C. W. Eichelberger, et al.; U.S. Pat. No. 07/459,844, filed Jan. 2, 1990, entitled "Area-Selective Metallization Process" by H. S. Cole, et al.; U.S. Pat. No. 5,258,920, filed Dec. 26, 1989, entitled "Locally Orientation Specific Routing System" by T. R. Hallet, et al.; U.S. Pat. No. 5,169,678, filed Dec. 26, 1989, entitled "Laser Ablatable Polymer Dielectrics and Methods" by H. S. Cole, et al.; U.S. patent application Ser. No. 454,546, now abandoned filed Dec. 21, 1989, entitled "Hermetic High Density Interconnected Electronic System" by W. P. Kornrumpf, et al.; U.S. Pat. No. 5,040,047 filed Dec. 26, 1989, entitled "Enhanced Fluorescence Polymers and Interconnect Structures Using Them" by H. S. Cole, et al.; and U.S. patent application Ser. No. 454,545, filed Dec. 21, 1989, abandoned in favor of divisional application Ser. No. 646,112, filed Jan. 28, 1991 entitled "An Epoxy/Polyimide Copolymer Blend Dielectric and Layered Circuits Incorporating It" by C. W. Eichelberger, et al. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line and other wave impedance matching effects have not needed to be considered.

The interconnection of microwave structures presents many problems, considerations and challenges not faced in the interconnection of digital systems. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

The related application Ser. No. 17/504,821 now abandoned overcomes the problems of reworkability and poor passive component tolerances of the prior art thin and thick film microwave system assembly methods whereby if a microwave system, when assembled does not meet specifications, it can be disassembled for removal of faulty components and reassembled without danger to good components.

Related U.S. Pat. No. 5,206,712 provides a solution to the problem of packaging microwave components in an efficient, reliable, high yield manner which makes the assembly of a microwave system from prepackaged components attractive and desirable, both from an efficiency and yield point of view.

A technique and system for testing microwave components is needed which provides a high correlation between the results of component testing and the performance of systems assembled from tested components in order to facilitate the provision of high yield, low cost microwave system assembly.

OBJECTS OF THE INVENTION

Accordingly, a primary object of the present invention is to provide a technique for testing microwave components and subsystems in an efficient, high correlation, non-destructive manner.

Another object of the present invention is to provide a test system suitable for use in the testing of microwave components and subsystems in a non-destructive, high reliability manner.

Another object of the present invention is to connect microwave components to be tested to a test fixture in the same way as they will ultimately be connected in a final system.

SUMMARY OF THE INVENTION

The above and other objects which will become apparent from the specification as a whole, including the drawings, are achieved in accordance with the present invention through use of a test fixture which includes a mounting location for a microwave component to be tested and adjacent thereto in appropriate alignment with the location of terminals on the microwave component provides transmission lines and other appropriate conductive structures for connection of the microwave component to a test probe or other test system. Connections between the microwave component and the adjacent structure of the test fixture may preferably be provided by a high density overlay layer interconnect structure which provides appropriate impedance matching and/or transformation between the microwave component and the test ports on the test fixture. For high power testing, the microwave component is preferably bonded to the test fixture in the mounting location in a manner which facilitates the non-destructive removal of the component following testing. The test fixture is reusable because of the use of higher temperature materials for any high density interconnect structures which are a permanent part of the test fixture than is used for mounting the component and for connecting the component to the test fixture. Consequently, the test connections can be removed both from the component and the test fixture without adverse effect on either of them and the component can be removed from the test fixture after testing.

In an alternative embodiment, most or all of the conductors of the test fixture are formed on the dielectric layer whereby via holes are only needed in the dielectric layer in alignment with contact pads of the component to be tested and the dielectric does not need to be removed over test probe contact points in order for the probe to make contact to the conductors of the test fixture.

High efficiency, low cost testing can be provided using a test fixture which includes a plurality of mounting locations and associated test fixture conductive structures so that a step and repeat testing of components mounted on the test fixture can test a plurality of components using a single interconnection overlay structure for all of the components. Such a multi-component test fixture may be designed for testing a single component type or for the testing of differing component types at different sites as may be considered desirable.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
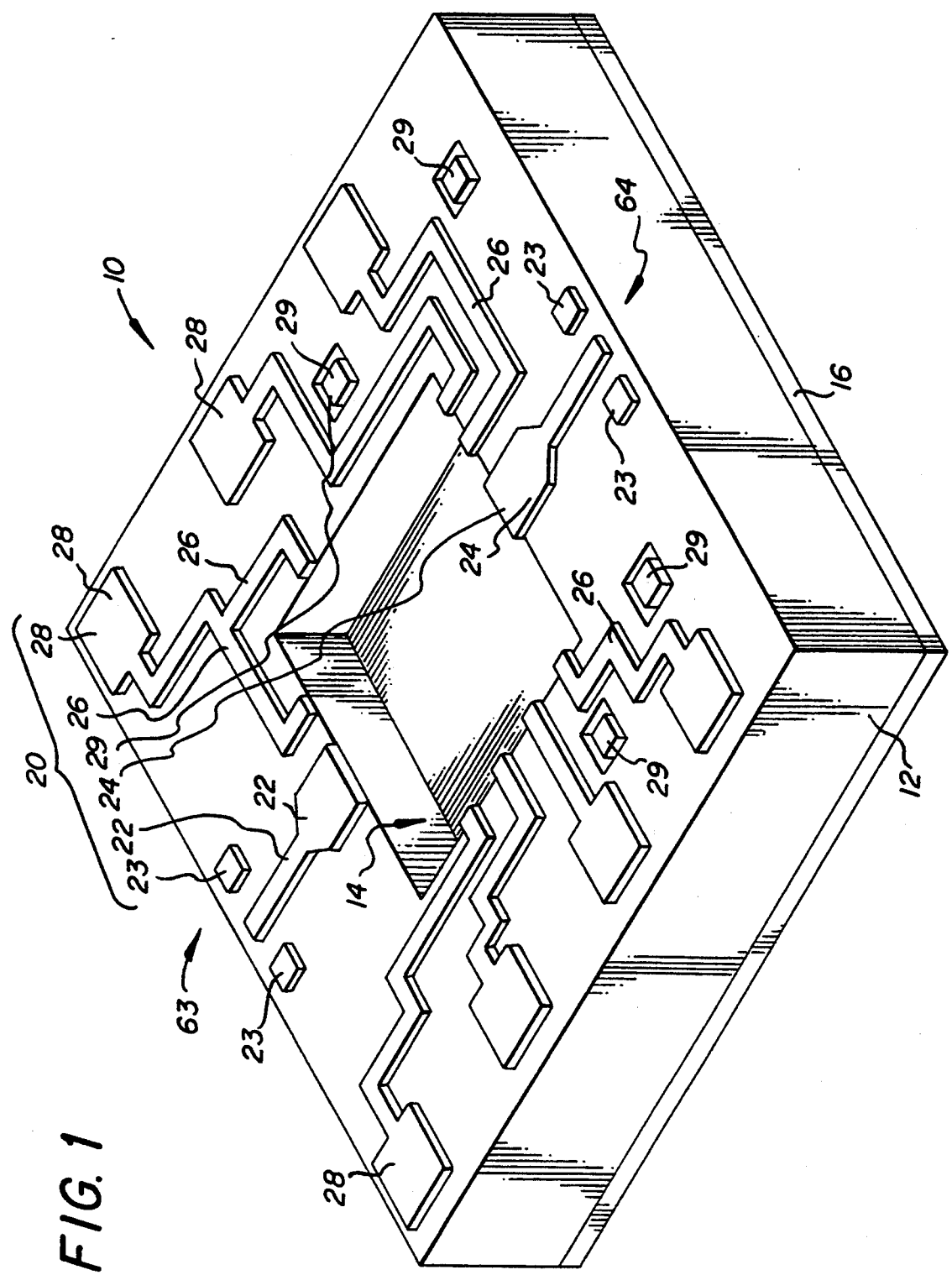
FIG. 1 is a three dimensional view of a test fixture suitable for the testing of a single microwave component.

A test fixture 10 suitable for the testing of a particular microwave component is illustrated in perspective view at 10 in FIG. 1. The test fixture 10 comprises a substrate 12 having a cavity 14 therein in which a component to be tested is to be disposed. In the fixture illustrated, the cavity 14 extends only partway through the substrate 12. In accordance with the desired connections to be made to the component to be tested, the cavity 14 may be provided with either a conductive or non-conductive bottom. In the illustrated embodiment, a ground plane 16 is provided on the bottom surface of substrate 12. In this embodiment, the bottom of the cavity 14 may preferably be electrically connected to ground conductor 16. A set 20 of conductors (22, 23, 24, 26, 28 and 29) suitable for interconnecting a component mounted in the cavity 14 to a test probe is disposed on the upper surface of the substrate 12. The conductors of set 20 may be formed as a single patterned conductive layer. In the illustrated embodiment, a number of relatively large test probe contact pads 28 are disposed directly on the upper surface of the substrate 12. Appropriate DC bypass capacitors 29, which may preferably be chip capacitors are disposed in cavities in substrate 12 and have one terminal ohmically connected to the ground plane 16, as by soldering, that is, with the bottom of the capacitor containing cavities comprised of the ground plane 16 or conductive material connected thereto. Two signal conductors 22 and 24, which are configured to provide desired microwave impedance characteristics, are also disposed on the upper surface of the substrate 12 along with adjacent ground terminals 23 at probe connection ends of the conductors 22 and 24 in order to provide microwave probe connection ports 62 and 64, respectively, remote from the cavity 14. The ground terminals 23 are preferably connected to the underlying ground plane 16 through via holes in the substrate 12.

A plurality of conductors 26 extend from the contact pads 28 to the edge of the cavity 14 in alignment with the location on the component to be tested of corresponding contact pads. If desired, the fixture 10 may include a pattern of conductors which is compatible with a variety of different component types in order to make the fixture more versatile.

Figure 2:
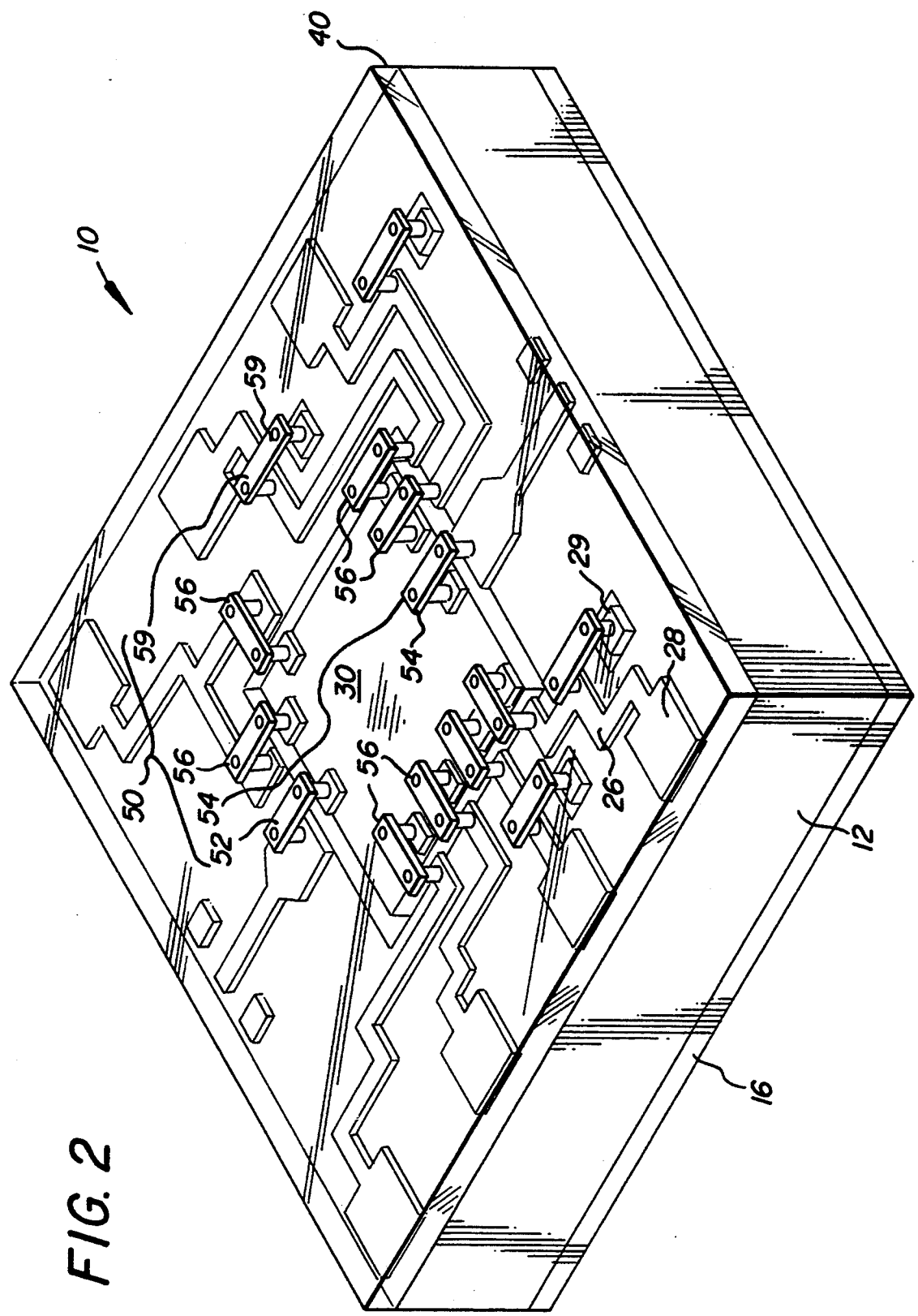
FIG. 2 is a three dimensional view of the test fixture of FIG. 1 with a microwave component mounted therein.

In FIG. 2, the fixture 10 is illustrated with a component 30 to be tested mounted in the microwave component-to-be-tested mounting location (the cavity 14). A dielectric layer 40 is disposed over the conductors 20, bypass capacitors 29 and the component to be tested 30 and the conductors disposed thereon and bridges the gap between the component 30 and the substrate 12. A set 50 of connection conductors 52, 54, 56 and 59 are disposed on this dielectric layer. Each of the conductors 52, 54 and 56 is connected both to a corresponding pad on the component to be tested and a corresponding conductive run on substrate 12 through via holes in the dielectric layer 40. The conductors 59 connect the bypass capacitors to the conductors 26 through other via holes in the dielectric overlay layer.

This interconnection structure includes unique features when it is fabricated by first bonding the dielectric layer to the underlying structure, then forming the via holes in the dielectric by laser "drilling" from above and then depositing the metal of the conductors 50 over the dielectric and in the via holes where it makes ohmic contact to the underlying contact pad or other metallization. In particular, the external configuration of the metal in the via hole takes on the shape of the via hole, rather than vice versa as would be the case if the metal were formed first (as by wire bonding or other processes) and the dielectric filled in around it. The nature of the laser drilling process, which is used to form the via holes by drilling from the top, typically results in a via hole which is wider at the top than at the bottom. This via hole shape provides improved metal continuity between the portion of a conductor which is disposed at the bottom of a via hole and the portion which is outside the via hole. This is because the via hole wall surface on which the metal is deposited has a sloping-upward-and-outward configuration which is known from the semiconductor arts to result in a deposited metallization layer achieving better step coverage than is achieved where the step has a vertical wall surface. The term step coverage refers to the uniformity of the metal coverage where the deposition surface changes levels from one planar surface area (the bottom of the via hole) to another planar surface area (the top of the dielectric layer). When the conductors are formed in accordance with the preferred manner described in the background Patents and Patent Applications, the upper surface of the metal conductor typically has a depression or dimple in it at the via hole because the metal of the conductors is deposited to a substantially uniform thickness everywhere, including in the via holes (which are not filled prior to deposition of the metal across the planar surface of the dielectric layer). Consequently, the surface topology of the metallization is similar to the surface topology of the layer on which it is deposited.

Figure 3:
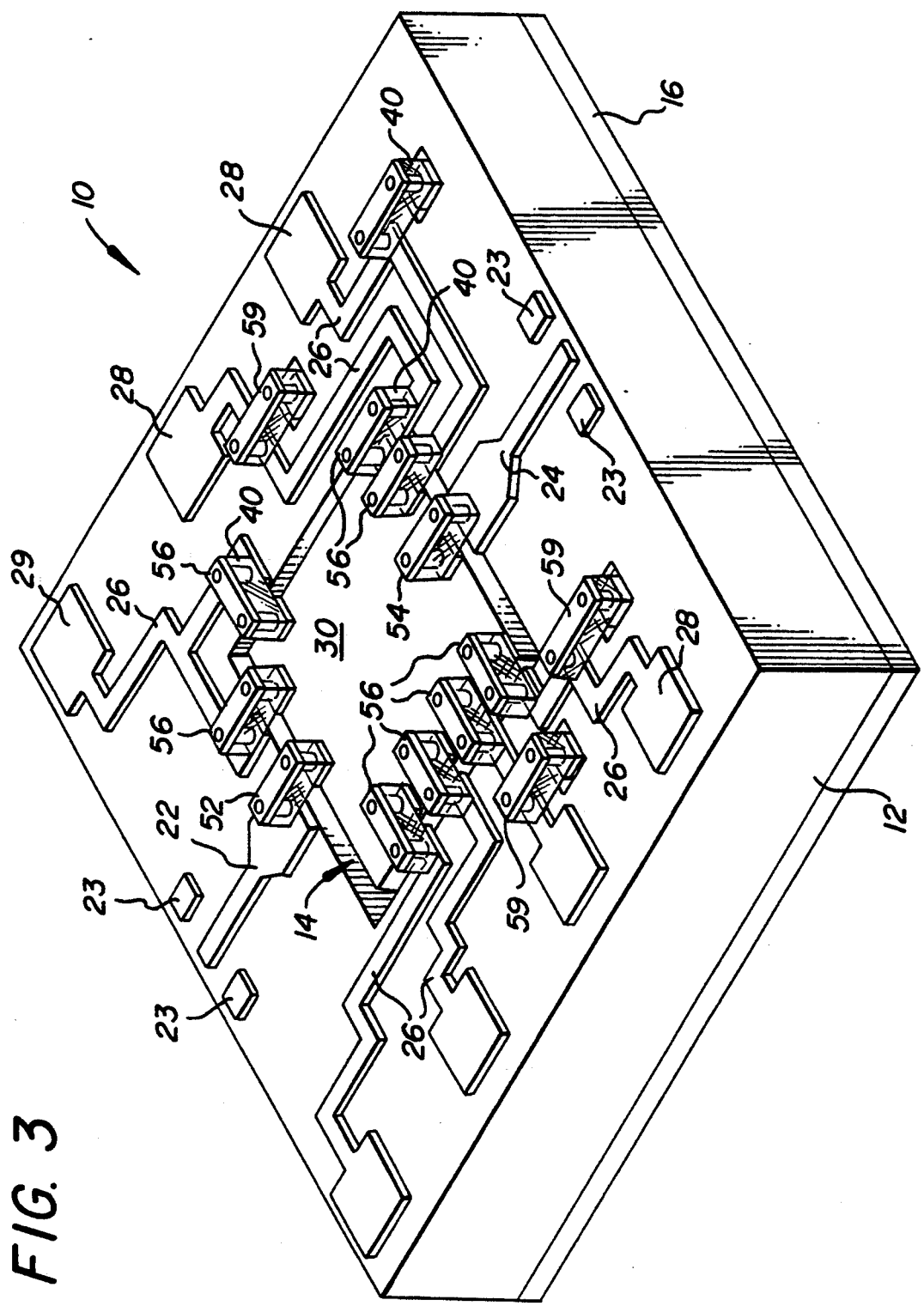
FIG. 3 is a view similar to FIG. 2 with the test fixture ready for connection to a test probe.

In FIG. 3, the fixture 10 is illustrated in a ready-for-testing configuration. As illustrated in FIG. 3, the dielectric layer 40 has been removed every place except where a conductor of the set 50 lies directly over that dielectric. In this manner, the layer 40 of dielectric material comprises a plurality of spaced apart segments and the component 30 is left in as close to being free of overlying dielectric material as is feasible in view of the use of the high density interconnect structure for connecting the component to the test fixture 10. Briefly, benefits of this dielectric layer removal or segmentation are a minimization of any adverse affects on the component 30 as a result of the dielectric layer 40 having a higher dielectric constant than the air which is adjacent the component in FIG. 3. This dielectric removal step may be carried out by ultraviolet ablation of the dielectric layer using either a laser or a high intensity noncoherent UV source in the manner discussed in more detail in related application Ser. No. 07/504,821 now abandoned.

The individual conductors of the conductor set 50 serve as masks during this ablation process to protect the dielectric material disposed directly thereunder while leaving the remainder of the dielectric material exposed for ablation. Following the UV ablation, the test fixture is preferably cleaned in a $CF_4$ and $O_2$ plasma to remove any residual dielectric material from the ablated regions.

Alternatively, the dielectric layer may be left in place everywhere over the substrate 12 except over the contact pads 28 and the microwave transmission line ports 62 and 64 in order to expose those contact pads for connection to the probe while leaving the remainder of the fixture and component coated with the dielectric layer 40 in order that the test conditions, may as closely as possible, mimic the conditions in which the component will be mounted in a system in which the dielectric layer remains in place on top of the component. Removal of the dielectric in this pattern may be accomplished with a similar light source as discussed above, but employing a mask or scanning pattern limitation to prevent ablation of the dielectric except in the vicinity of the contact pads.

In this configuration, the region at the microwave ports 62 and 64 and the surfaces of the contact pads 28 are free of overlying dielectric materials to facilitate direct connection of a test probe to these structures. For testing, a test probe, which may be of the co-planar type, is brought into appropriate contact with each of these contact pads or ports and appropriate test signals applied to the fixture and thus, the active component, while the outputs from the active component are appropriately monitored. From the relationship between the input and control signals and the detected output signals, the quality of the device under test is determined. Characteristics which may be determined include a go/no go status for the component where a logic function fails to operate properly, input and output microwave impedances, input power, output power and whatever other characteristics may be appropriate to the device under test.

A particular benefit of this testing system is the ability to determine microwave input and output impedances for this active component as well as an optimum source impedance for minimum noise figure, or an optimum load impedance for maximum power transfer. As a consequence of this ability, the microwave component may have its microwave connections tailored to match its impedance when the component is mounted in a microwave package such as that disclosed in related U.S. Pat. No. 5,206,712 or when being directly assembled into a final system in the manner disclosed in related application Ser. No. 07/504,821 now abandoned. Thus, improper, unexpected and normal variations in component input and output impedances can be compensated for in accordance with those teachings, provided that impedance is known.

If desired, once microwave impedances have been determined, if they in fact deviate more than an expected tolerance from their design value, the test connection structure comprised of dielectric layer 40 and the set of conductive runs 50 may be removed and a new test connection structure reapplied in which the conductor runs 50, especially 52 and 54, are appropriately modified to provide an impedance match between the component's already measured impedance values and the test structure. The device may then be retested to determine its operating characteristics when properly matched in order to determine whether the component can meet component specifications when packaged in an impedance matched manner.

Following testing, the dielectric layer 40 and the set 50 of overlying conductors are removed from the test structure by heating the test structure to the softening point of the thermoplastic adhesive which has bonded the layer 40 to the substrate 12. The layer 40 is then peeled off the structure in the manner taught in background HDI application Ser. No. 283,095, now U.S. Pat. No. 4,878,991 to leave the component under test and the test substrate free of interconnections. While the test fixture is still hot, the component 30 may be removed since its thermoplastic adhesive is also liquid at this temperature or is liquid when the temperature is increased slightly. Any residual dielectric material left on the component may be removed by any of a variety of processes. The component may be immersed in a solvent for the dielectric material to remove it in that manner. Alternatively, a ultraviolet ablation technique may be used to remove any remaining dielectric material followed by a plasma etch to remove any residue. Other appropriate techniques may also be employed. Following this cleanup procedure, the component may be stockpiled as is or packaged in accordance with related U.S. Pat. No. 5,206,712 for future use or may be directly assembled into a system in accordance with the related application Ser. No. 07/504,821 now abandoned.

All of the dielectric overlay and conductive structures of this fixture and its interconnection to the component to be tested may be provided using the process and techniques disclosed in the background HDI patents and applications listed above.

Figure 4:
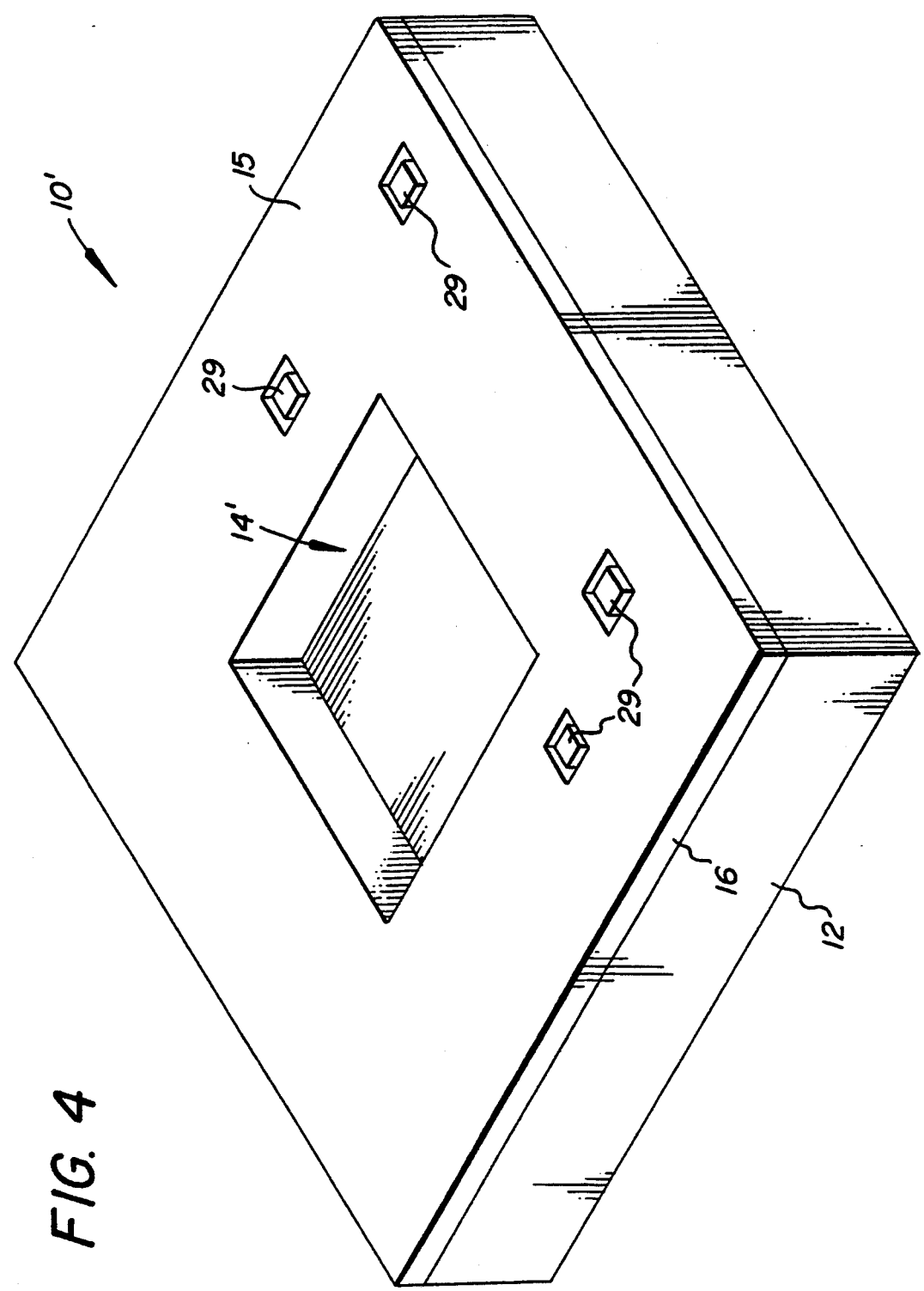
FIG. 4 is a three dimensional illustration of an alternative configuration of the test fixture prior to mounting of a component to be tested.

FIG. 4 is a three dimensional illustration of an alternative embodiment 10' of a test fixture similar to that illustrated in FIG. 1. Fixture 10' differs from fixture 10 in that the conductors 20 are not present on this substrate. The substrate 12' preferably is either conductive itself or has a conductive upper surface 15 which may be provided by a layer of metal 16' disposed on the upper surface of a nonconductive portion of the substrate 12'. Alternatively, the entire substrate 12' may be a single block of metal or other conductive material. The substrate 12' has cavities therein in which bypass capacitors 29 are mounted. The bypass capacitors 29 are in the same locations in substrate 12' as they are in substrate 12.

Figure 5:
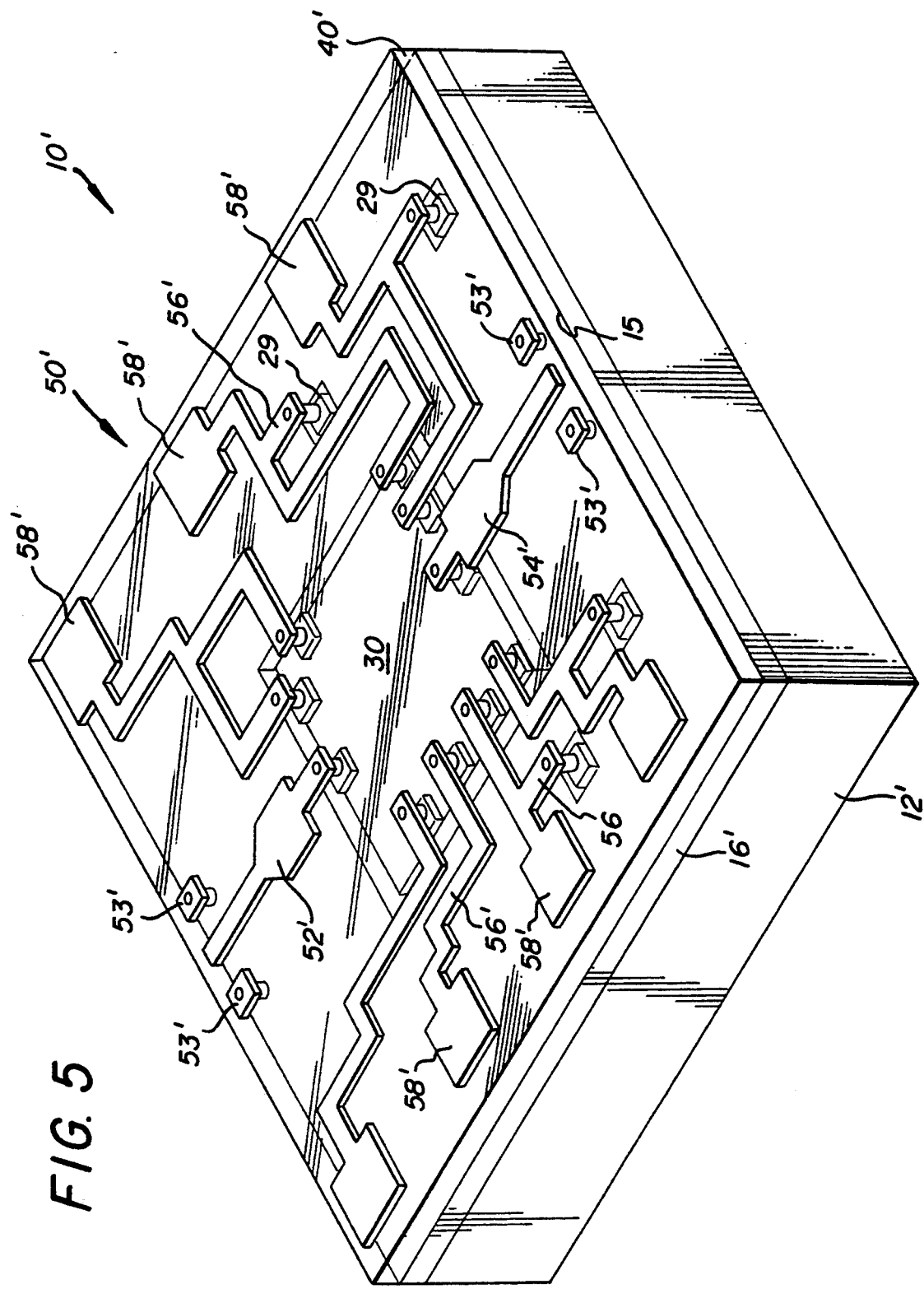
FIG. 5 is an illustration of the FIG. 4 test fixture with a component to be tested mounted therein ready for testing.

In FIG. 5, the test fixture 10' is illustrated with a component 30 mounted therein ready for testing. The set 50' of conductors disposed on the upper surface of the dielectric layer 40 comprises a pattern which is a combination of the pattern of the set 20 which is disposed on the substrate 12 in FIG. 1 and the set 50 which is disposed on the dielectric layer 40 in FIG. 2. In applying reference numerals to the individual conductors of metallization pattern 50', it was arbitrarily decided to number the conductors in the 50s rather than in the 20s, because they are disposed on top of the dielectric layer 40'. The final digit of each reference numeral is the same as the final digit of the corresponding conductor in FIG. 2.

The embodiment 10' illustrated in FIG. 5 differs from the embodiment 10 in several ways.

First, in the embodiment 10', all of the conductors are disposed on the upper surface of the dielectric layer 40'. In this way, each of the contact pads 58' is accessible for probe contact without any need to remove any dielectric material therefrom.

Second, the conductors of pattern 50' are more like the conductors of a final system in that the conductors run a distance from the edge of the component 30 before reaching a via hole through which they are connected to another component or a contact pad on the substrate of that system.

Third, because no custom conductors are disposed on the substrate itself, the fixture 10' is suitable for the testing of any component 30 whose size is appropriate to the dimensions of the cavity (width, length and depth). Further, substantially more bypass capacitors may be provided in the substrate 12' than are illustrated in FIG. 4 with selected ones of those bypass capacitors being connected into the test network in accordance with the configuration of the component to be tested and the test conductor pattern.

Fourth, the ground plane for the microwave transmission lines of the test structure is the conductive upper surface of the substrate 12' with the result that the ground conductor is much closer to the signal conductors. This results in higher isolation for the resulting transmission lines than is provided by the fixture 10 in which the ground conductor is on the back side of the substrate.

Fifth, the fixture 10 ' provides higher isolation which enables a high interconnect density or smaller size.

Sixth, lower impedance transmission lines can be fabricated in this structure because of the thinness of the dielectric layer of the resulting transmission lines.

Seventh, this test fixture itself is simpler to fabricate.

The test fixture 10' also suffers from several potential disadvantages relative to the fixture 10 of FIG. 2. First, the test network is subject to change from component-to-component, since it is separately fabricated for each component with the result that any variations in the metallization patterning portion of the process may result in modified impedances for the test structure itself. However, this is not considered a significant limitation when the techniques taught in the background high density interconnection patents are employed for the fabrication of this patterned conductive layer. This is because the patterning accuracy of that system is as tight as ±5% for a 0.8 mil wide line.

Figure 6:
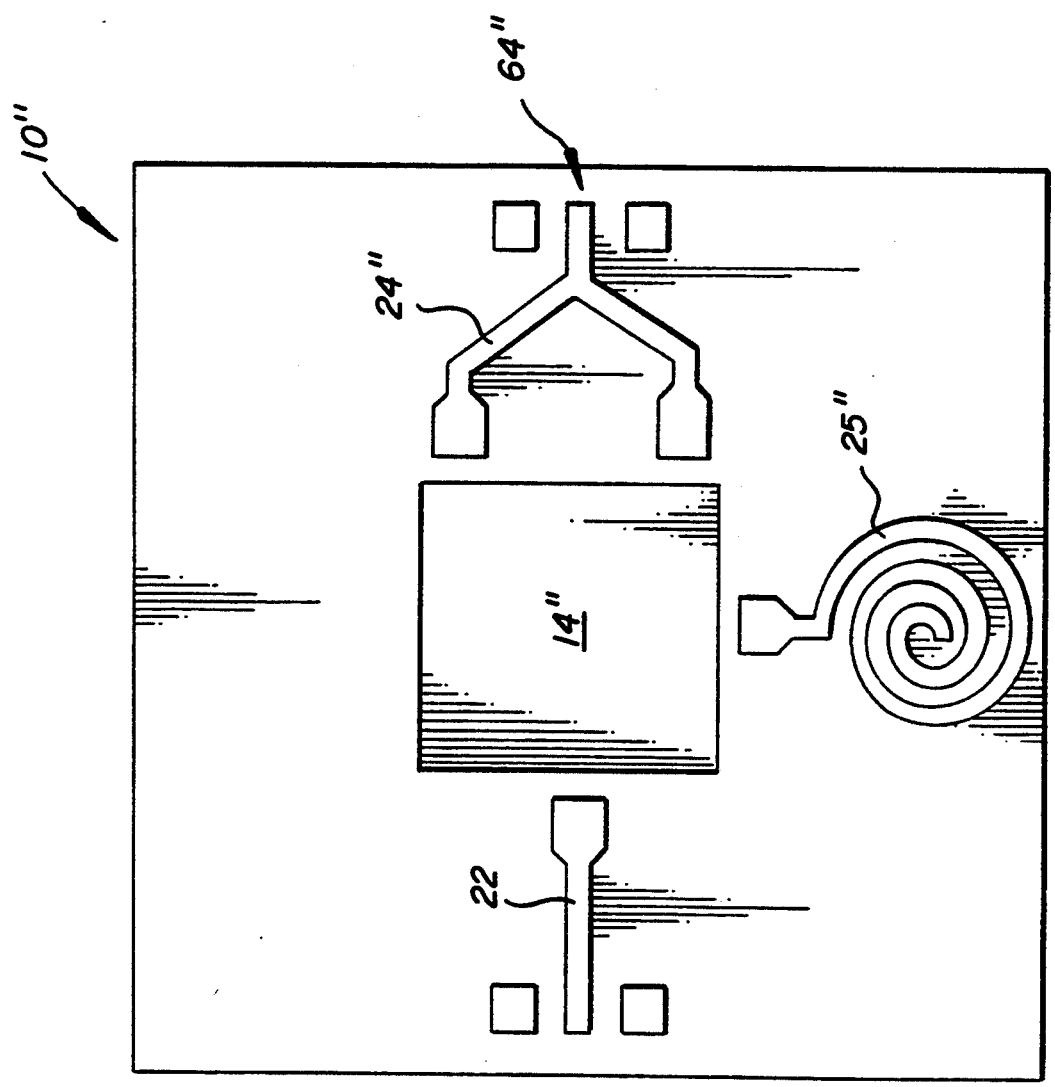
FIGS. 6 and 7 are plan view illustrations of alternative or modified versions of test fixtures in accordance with the present invention.

In FIG. 6, an illustrative alternative test structure is illustrated in plan view in which the test fixture 10" combines the signals from two microwave outputs of a single component which are connected to the two "arms" of a Y-shaped signal conductor 24" into a single test fixture output port 64" which is connected to the "leg" of the Y-shaped conductor. Such a test structure is considered desirable where the microwave component to be tested is designed to have its two outputs combined in the structure into which it is connected. With such an intended connection for the component, the component can only be properly tested with such a connection in place. The inclusion of this connection within the test fixture obviates any need to include such a combiner on the component itself which would undesirably increase the size of the component.

Also illustrated in FIG. 6 is a conductor 25' in the shape of a spiral which constitutes an RF choke when the end of the conductor at the center of the spiral is connected to a control or DC line in the high density overlay structure.

Figure 7:
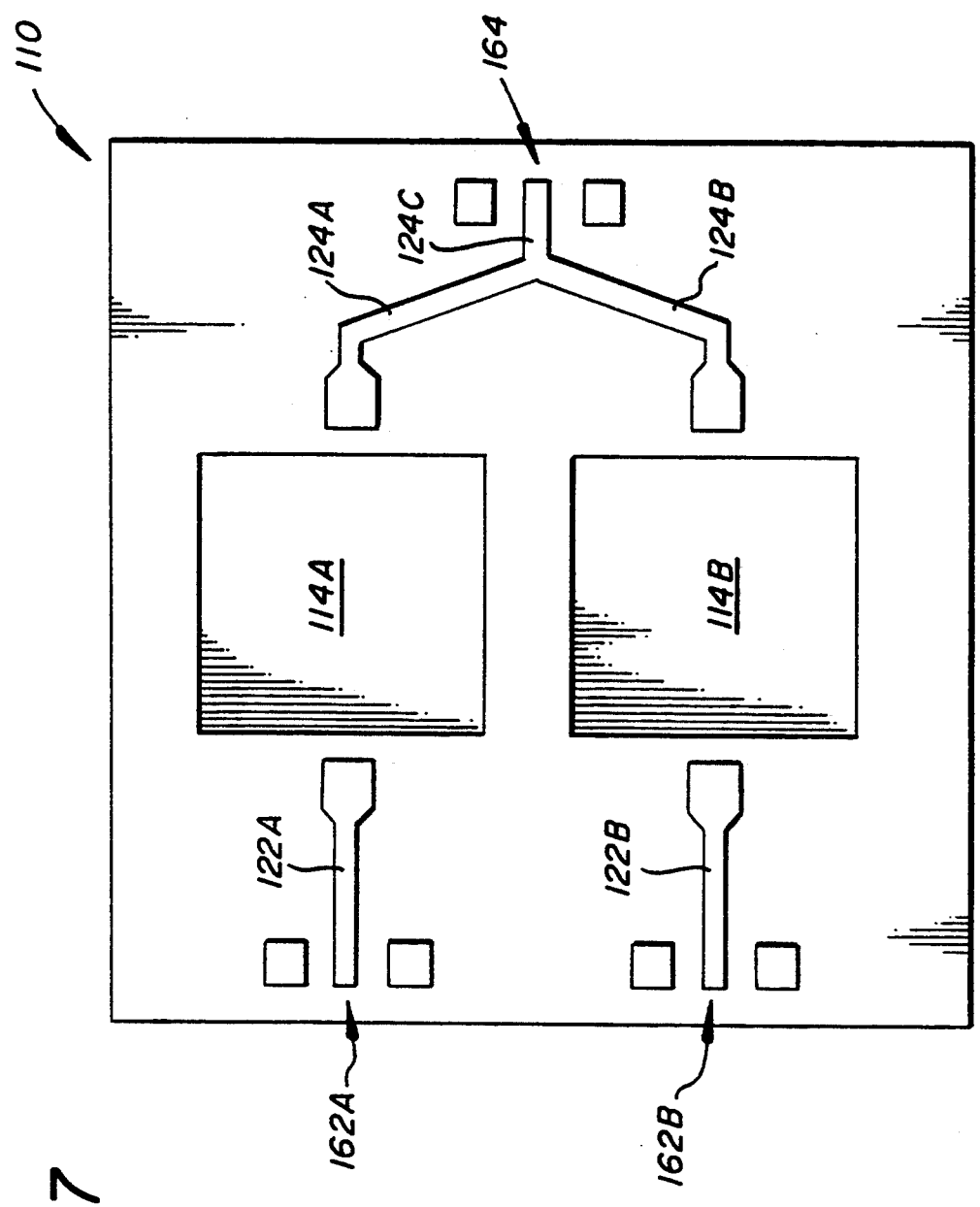

In FIG. 7, a further alternative test fixture configuration 110 is illustrated in plan view. The fixture 110 is similar to the fixture 10, except for the provision of two cavities 114A and 114B for the mounting of components to be tested and the inclusion of a combiner comprised of signal lines 124A, 124B and 124C to combine an output from a component mounted in the cavity 114A with an output from a component mounted in the cavity 114B. In the illustrated embodiment, the input signal conductors 122A and 122B have separate input ports 163A and 163B for connection to the test probe. However, this is dependent on the configurations of the components to be tested. Where desirable, a single input port could be provided with a divider dividing the input signal between the component mounted in cavity 114A and the component mounted in cavity 114B.

As an alternative to the connected-in-parallel connection illustrated in fixture 110 of FIG. 7, the cavities for mounting of the components to be tested could be appropriately positioned and the test fixture connecting conductors could be provided in a configuration to connect the two chips in series or cascade rather than in parallel.

Figure 8:
FIG. 8 is a schematic illustration of a multi-component test fixture which comprises an array of individual test fixtures, each of which is in accordance with this invention.

In FIG. 8, a multi-component test structure 100 is illustrated. Test Structure 100 comprises a rectangular matrix of individual test fixtures 10. A separate component to be tested is preferably mounted in each of the test fixtures 10 of structure 100 in preparation for testing. A single dielectric layer 40 (FIG. 2 or 5) is then laminated over the entire structure 100 and the set 50 of connecting conductors is formed thereon in a single application of the high density interconnect structure metallization process. All of these components to be tested are then ready for testing. Consequently, a step and repeat process may be employed to test each of these identical components. As an alternative to providing such a multi-component test structure which is designed to test a single component type, different test fixtures in the structure 100 may be designed for the testing of different components with the result that a plurality of different components may be mounted on the same test fixture and appropriately tested. If desired, adjacent test fixture cells may be interconnected by conductors of the set 50 so that related components may be tested together to determine their overall operating characteristics as well as their individual operating characteristics.

Test structures in accordance with this invention provide excellent correlation between measured component characteristics and the component's characteristics in a properly assembled final system because of the ability of the test system to duplicate the final system's connection characteristics as to impedance and so forth in the test system and its ability to provide data for modifying the characteristics of the final system's connections from a nominal configuration to a more appropriate configuration in accordance with the actual (measured) characteristics of that specific component.

As a consequence, components under test which would normally be considered out-of-specification, may be brought into specification by appropriate interconnection in a package or final system in a manner which is not possible in the prior art where such test results are not available and such interconnection techniques are not feasible.

A further advantage of this test technique is that where two separate active microwave components must have accurately matched characteristics, they can be mounted in adjacent test fixtures 10 of an array test structure 100 or in a single test fixture, as may be considered appropriate. Identical test signals may then be simultaneously applied to both components or devices and their outputs electronically compared to determine the degree of match between the components or, where appropriate, their outputs can be combined in the test fixture in a manner to provide a test fixture output which is the difference between the outputs of the components whereby the magnitude of the output from the test fixture is a measure of the difference between the characteristics of the two components.

Since the test connection structure of this test fixture has no detrimental effect on the components, a component may be mounted in and connected to this test fixture one or more times as may be appropriate to testing or sorting components. Consequently, where closely matched pairs of components are required, they may be initially screened and divided into groups of similar components and then further screened within each group or mounted in sets for direct testing of the degree to which components match each other and where an insufficient match is obtained, one or more of the components of a set may be removed and replaced by other components until a set of satisfactory matched components is obtained.

A major advantage of this test structure and technique is the fact that the component is mounted in the test structure in essentially an identical manner to that in which it will be mounted in the final system into which it is connected. Consequently, many of the variables which contribute to inaccurate or low correlation testing of microwave components in the prior art (such as different connection configurations, pressure contacts as opposed to bonded contacts and so forth) are absent in this test fixture, all of which facilitates accurate testing and contributes to the high correlation between test results and in-system performance of components tested in accordance with this invention.

A further advantage of this test fixture is that it can be designed to serve as a package for the microwave component (s) after the completion of testing in accordance with related U.S. Pat. No. 5,206,712, entitled, "A Building Block Approach to Microwave Modules", by W. P. Kornrumpf, et al.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of pre-testing microwave components comprising the steps of:
   providing a test fixture comprising a test substrate including:
      a mounting location for a component to be tested,
      first and second microwave transmission lines for connection to said component to be tested when said component to be tested is disposed at said mounting location, said first and second microwave transmission lines each having first and second ends, each of said first ends being disposed in the vicinity of said mounting location and each of said second ends being disposed remote from said mounting location, and
      a power supply terminal for connection to said component to be tested;
   disposing said component to be tested at said mounting location;
   connecting said first end of said first microwave transmission line to a first microwave port of said component to be tested, said first end of said second microwave transmission line to a second microwave port of said component to be tested and said power supply terminal to a power supply terminal of said component to be tested by the steps of:
      bonding a dielectric overlay layer to said test fixture and said component to be tested,
      providing an aperture in said dielectric overlay layer to expose conductive material on said component to be tested, and
      disposing a pattern of conductors on said dielectric overlay layer in ohmic contact with said power supply and control signal terminals, said first and second transmission lines and said conductive material on said component to be tested;
   applying power and a test signal to said component to be tested; and
   determining the response of said component to be tested to said test signal.

2. The method recited in claim 1 wherein:
   said pattern of conductors provides an microwave-impedance-matched connection between said component to be tested and first ends of said first and second transmission lines.

3. The method recited in claim 2 wherein said test fixture further comprises:
   means for connecting an microwave matched test probe to second ends of said first and second microwave transmission lines.

4. The method recited in claim 1 which further comprises, following the step of disposing a pattern of conductors on said dielectric overlay layer, removing said dielectric overlay layer every place except where a conductor lies directly over that dielectric.

5. A method of pre-testing microwave components comprising the steps of:
   providing a test fixture comprising a test substrate having a conductive surface and an open cavity for mounting a component to be tested;
   disposing said component to be tested at said mounting location, said component to be tested having contact pads on a first surface thereof and including a first microwave port;
   applying a dielectric overlay over said substrate and said first surface of said component and bridging any gap between said first surface of said component and the adjacent portion of the surface of said substrate and providing via holes in said dielectric layer in alignment with appropriate ones of said contact pads;
   forming a pattern of conductors on said dielectric overlay, said conductors including a first signal conductor which comprises a first microwave transmission line, said first signal conductor being connected to said first microwave port of said component to be tested;

connecting a test probe to appropriate portions of said pattern of conductors;

applying appropriate test signals to said component to be tested; and determining the response of said component to said test signal.

6. The method recited in claim 5 wherein the step of disposing comprises:

bonding said component to be tested to said mounting location.

7. The method recited in claim 5 wherein:

said pattern of conductors further comprises control signal lines for connecting control signals provided by said probe to said component to be tested.

8. The method recited in claim 7 further comprises:

removing said dielectric from portions of said component to be tested.

9. The method recited in claim 5 wherein:

said pattern of conductors comprises a second signal conductor which comprises a second microwave transmission line.

10. The method recited in claim 9 wherein:

said conductive surface of said substrate serves as the ground conductors of said first and second microwave transmission lines.

11. The method recited in claim 5 wherein:

said conductive surface of said substrate serves as the ground conductor of said first microwave transmission line.

12. The method recited in claim 5 wherein said pattern of conductors includes a standard configuration of probe contact pads for direct connection to said probe.

13. Testing apparatus for use in testing microwave components, said apparatus comprising:

a test substrate including:

a mounting location for a component to be tested, and first and second test ports for connection to said component to be tested when said component to be tested is disposed at said mounting location, said first test port being a microwave port and coupled to a microwave transmission line, said microwave transmission line having a second end disposed remote from said mounting location;

a dielectric overlay layer bonded to said test fixture and said component to be tested, said dielectric overlay layer having apertures exposing conductive material on said component to be tested and exposing said first and second test ports; and a pattern of conductors on said dielectric overlay layer in ohmic contact with said first and second test ports and said conductive material on said component to be tested for electrically connecting said component to be tested to said test ports.

14. The testing apparatus recited in claim 13 wherein said test substrate further includes:

a power supply terminal for connection to said component to be tested.

15. The testing apparatus recited in claim 14 wherein said test substrate further includes:

control signal terminals for connection to said component to be tested.

16. The testing apparatus fixture recited in claim 14 wherein said test substrate further includes:

means for connecting a microwave matched test probe to said second end of said test microwave transmission line.

17. The testing apparatus recited in claim 13, wherein said dielectric overlay layer is present only where a conductor lies directly over the dielectric layer.

* * * * *